United States Patent
Shimada

(10) Patent No.: US 11,664,299 B2
(45) Date of Patent: May 30, 2023

(54) MOUNTING BOARD AND SEMICONDUCTOR DEVICE

(71) Applicant: SHINKO ELECTRIC INDUSTRIES CO., LTD., Nagano (JP)

(72) Inventor: Seiichi Shimada, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 17/305,406

(22) Filed: Jul. 7, 2021

(65) Prior Publication Data
US 2022/0013440 A1     Jan. 13, 2022

(30) Foreign Application Priority Data
Jul. 13, 2020 (JP) .............................. JP2020-119617

(51) Int. Cl.
*H01L 23/498*     (2006.01)
*H01L 23/00*     (2006.01)

(52) U.S. Cl.
CPC .. *H01L 23/49811* (2013.01); *H01L 23/49838* (2013.01); *H01L 24/16* (2013.01); *H01L 2224/16227* (2013.01)

(58) Field of Classification Search
CPC ......... H01L 23/49894; H01L 23/49811; H01L 23/49838
See application file for complete search history.

(56) References Cited

U.S. PATENT DOCUMENTS

| 9,345,136 | B1* | 5/2016 | Kim | ........................ H05K 1/112 |
| 2013/0065330 | A1* | 3/2013 | Homma | .................. H01L 23/50 |
| | | | | 257/E21.502 |
| 2017/0221950 | A1* | 8/2017 | Ho | .................... H01L 27/14623 |

FOREIGN PATENT DOCUMENTS

JP     H06-216508     8/1994

* cited by examiner

*Primary Examiner* — Michele Fan
(74) *Attorney, Agent, or Firm* — IPUSA, PLLC

(57) ABSTRACT

A mounting board includes an electrode pad and an insulating protective film on an insulating resin layer. In a plan view, the electrode pad includes first and second sides running parallel in a first direction. The insulating protective film includes an opening including first and second regions adjoining each other in the first direction. The first region lies over the electrode pad to expose part of the electrode pad. The second region exposes part of the insulating resin layer. The first region is defined by third and fourth sides that are between the first and second sides in a second direction perpendicular to the first direction and run parallel in the first direction. The maximum dimension of the second region in the second direction is greater than the distance between respective ends of the third and fourth sides at which the first region adjoins the second region.

10 Claims, 9 Drawing Sheets

MOUNTING BOARD AND SEMICONDUCTOR DEVICE

CROSS-REFERENCE TO RELATED APPLICATION

This application is based upon and claims priority to Japanese patent application No. 2020-119617, filed on Jul. 13, 2020, the entire contents of which are incorporated herein by reference.

FIELD

A certain aspect of the embodiments discussed herein is related to mounting boards and semiconductor devices.

BACKGROUND

A printed wiring board that includes an electrode pad and a protective film on a substrate where an opening is formed in the protective film to expose part of the electrode pad has been proposed as a mounting board for mounting a chip component (see Japanese Laid-open Patent Publication No. 6-216508). According to this printed wiring board, a reservoir having the same width as the opening is formed next to the protective film in such a manner as to be adjacent to the opening.

SUMMARY

According to an aspect of the present invention, a mounting board includes an electrode pad and an insulating protective film on an insulating resin layer. In a plan view, the electrode pad includes first and second sides running parallel in a first direction. The insulating protective film includes an opening including first and second regions adjoining each other in the first direction. The first region lies over the electrode pad to expose part of the electrode pad. The second region exposes part of the insulating resin layer. The first region is defined by third and fourth sides that are between the first and second sides in a second direction perpendicular to the first direction and run parallel in the first direction. The maximum dimension of the second region in the second direction is greater than the distance between respective ends of the third and fourth sides at which the first region adjoins the second region.

The object and advantages of the invention will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
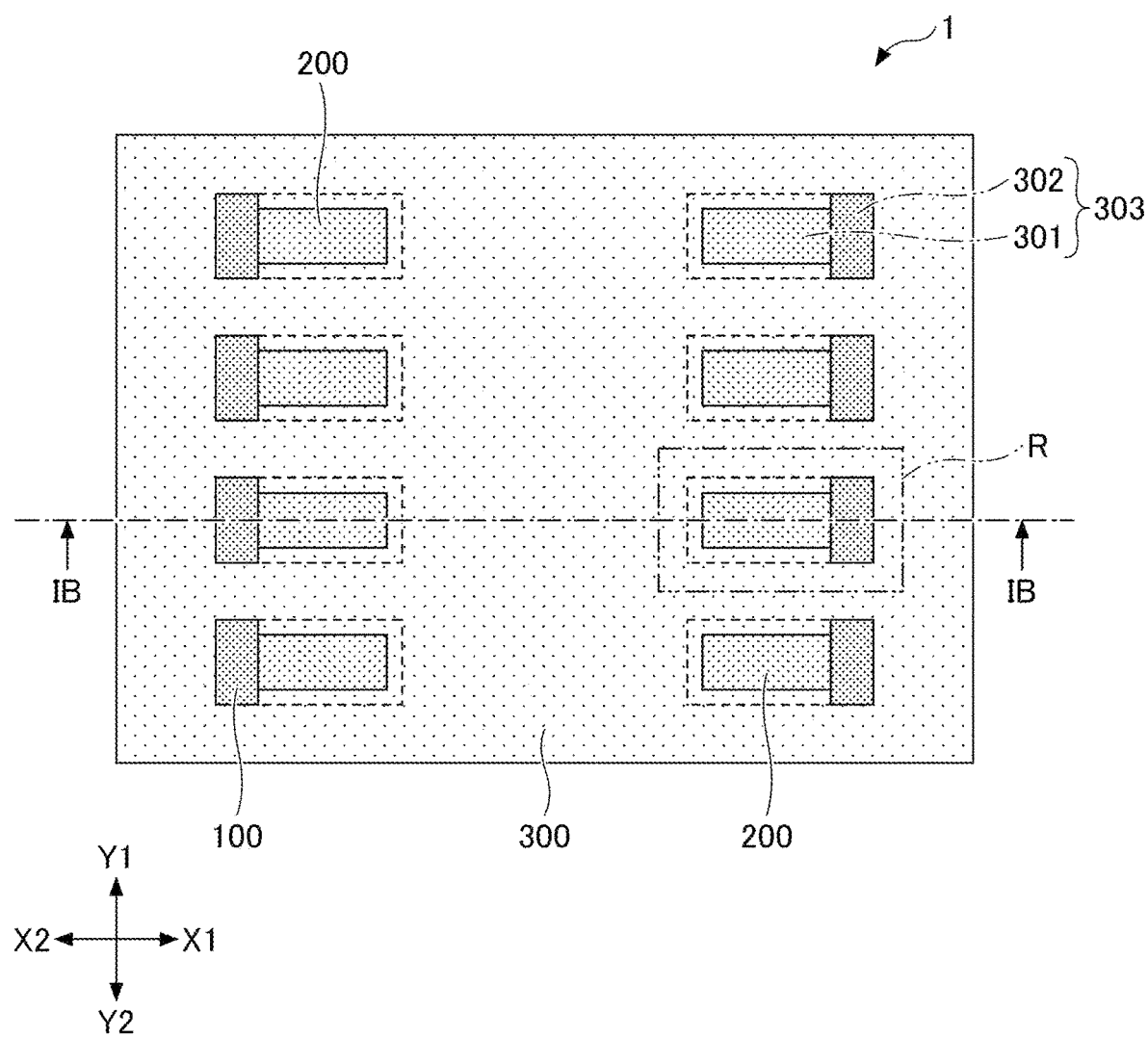
FIGS. 1A and 1B are diagrams illustrating a mounting board according to a first embodiment.

In the case of mounting an electronic component on the above-described related-art mounting board, it is difficult to establish connection with sufficient reliability.

According to an aspect of the present invention, a mounting board and a semiconductor device that can improve connection reliability are provided.

According to an aspect of the present invention, it is possible to improve connection reliability.

Embodiments are described in detail below with reference to the accompanying drawings. In the specification and drawings, components having substantially the same functional configuration are referred to using the same reference numerals, and a duplicate description thereof may be omitted. Furthermore, according to this disclosure, the X1-X2 direction (namely, the X1 or X2 direction), the Y1-Y2 direction (namely, the Y1 or Y2 direction), and the Z1-Z2 direction (namely, the Z1 or Z2 direction) are directions orthogonal to one another. Furthermore, a plane including the X1-X2 direction and the Y1-Y2 direction is referred to as "XY plane," a plane including the Y1-Y2 direction and the Z1-Z2 direction is referred to as "YZ plane," and a plane including the Z1-Z2 direction and X1-X2 direction is referred to as "ZX plane." For convenience, it is assumed that the Z1-Z2 direction is a vertical direction. Furthermore, a plan view refers to a view of an object taken from the Z1 side. A mounting board and a semiconductor device, however, may be used in an inverted position or oriented at any angle. The X1-X2 direction is an example of a first direction, and the Y1-Y2 direction is an example of a second direction.

First Embodiment

Figure 1B:
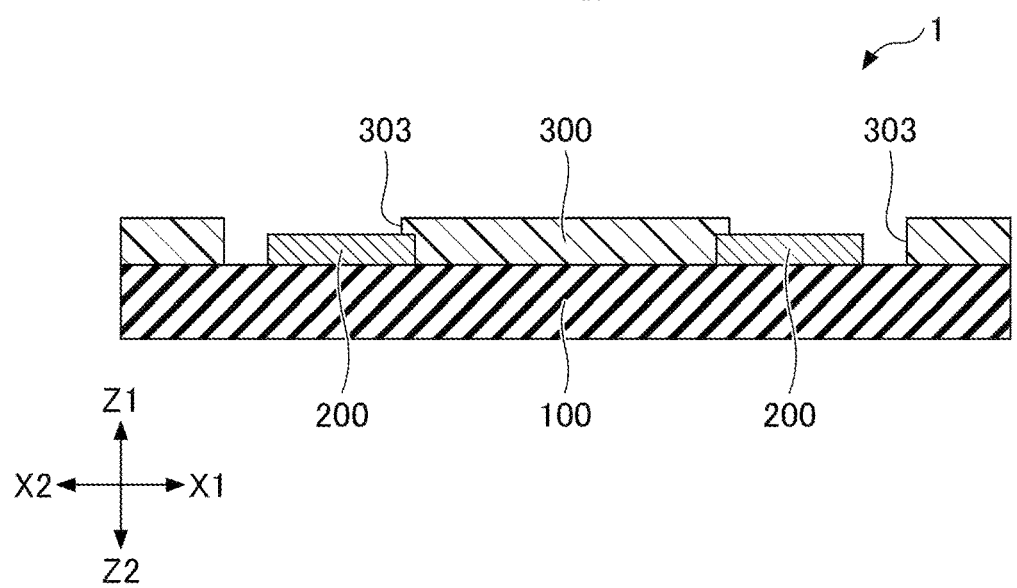
Figure 2A:
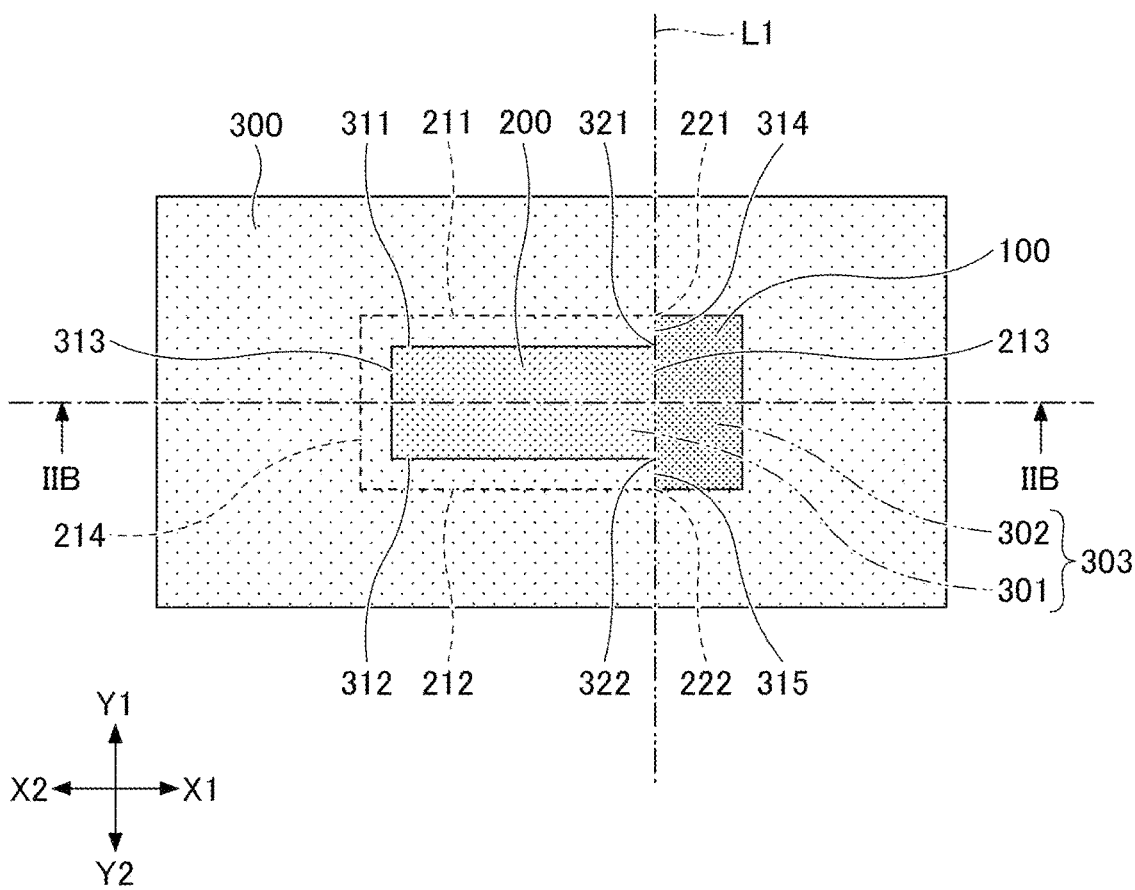
FIGS. 2A and 2B are enlarged views of part of the mounting board illustrated in FIGS. 1A and 1B.
Figure 2B:
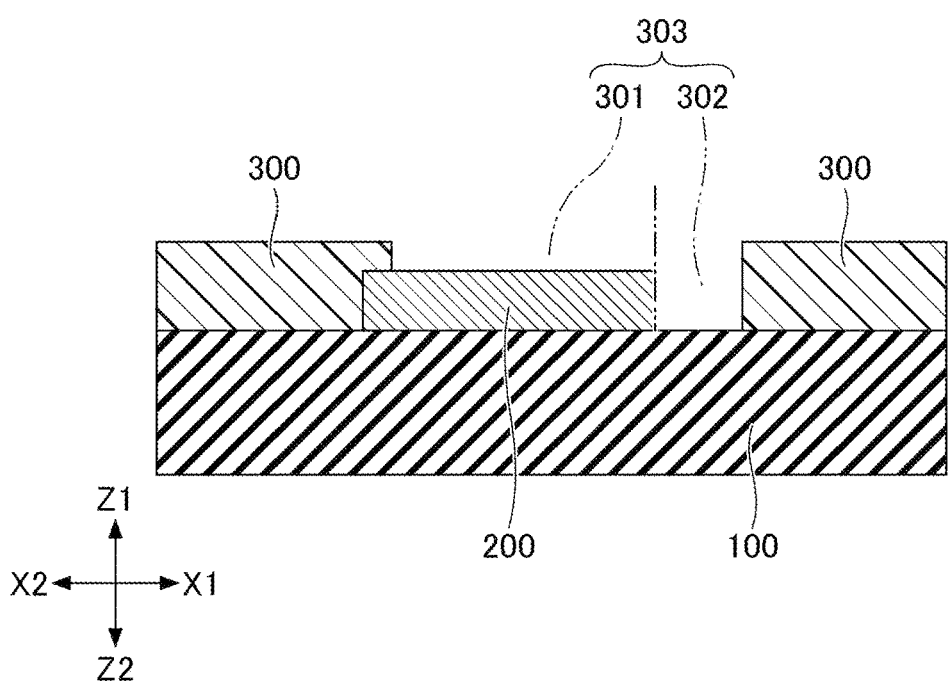
Figure 3A:
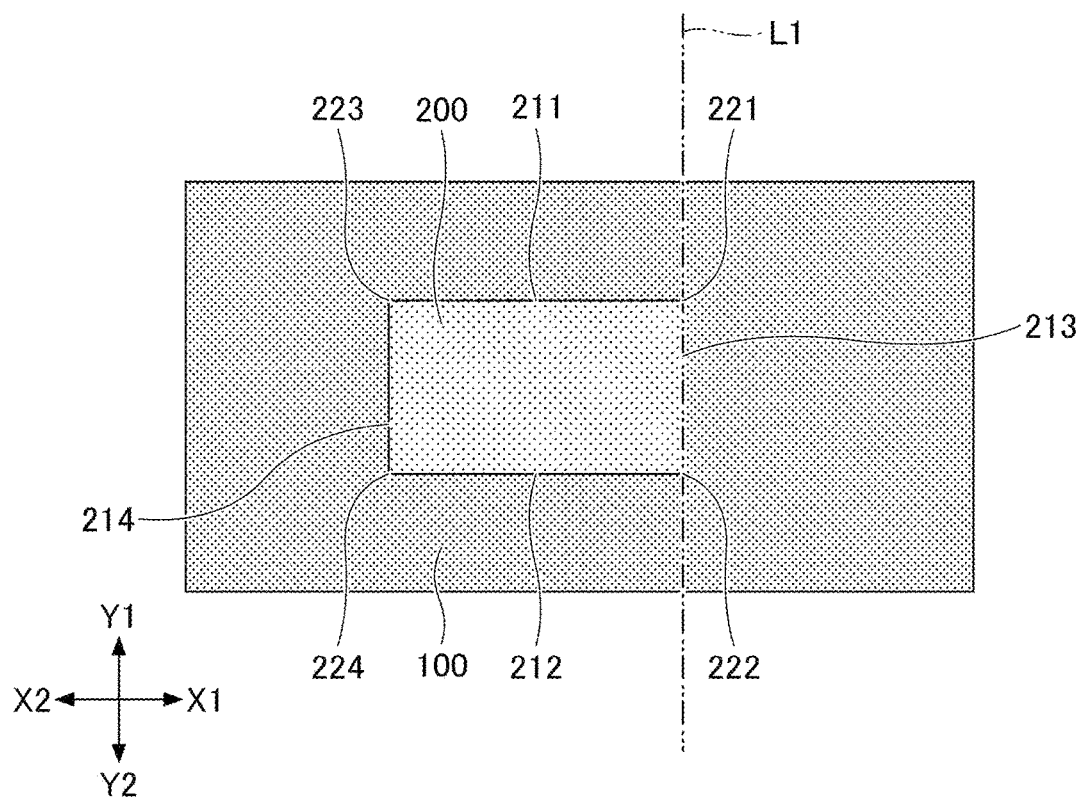
FIGS. 3A and 3B are diagrams separately illustrating an insulating resin layer and an electrode pad, and a solder resist according to the first embodiment.
Figure 3B:
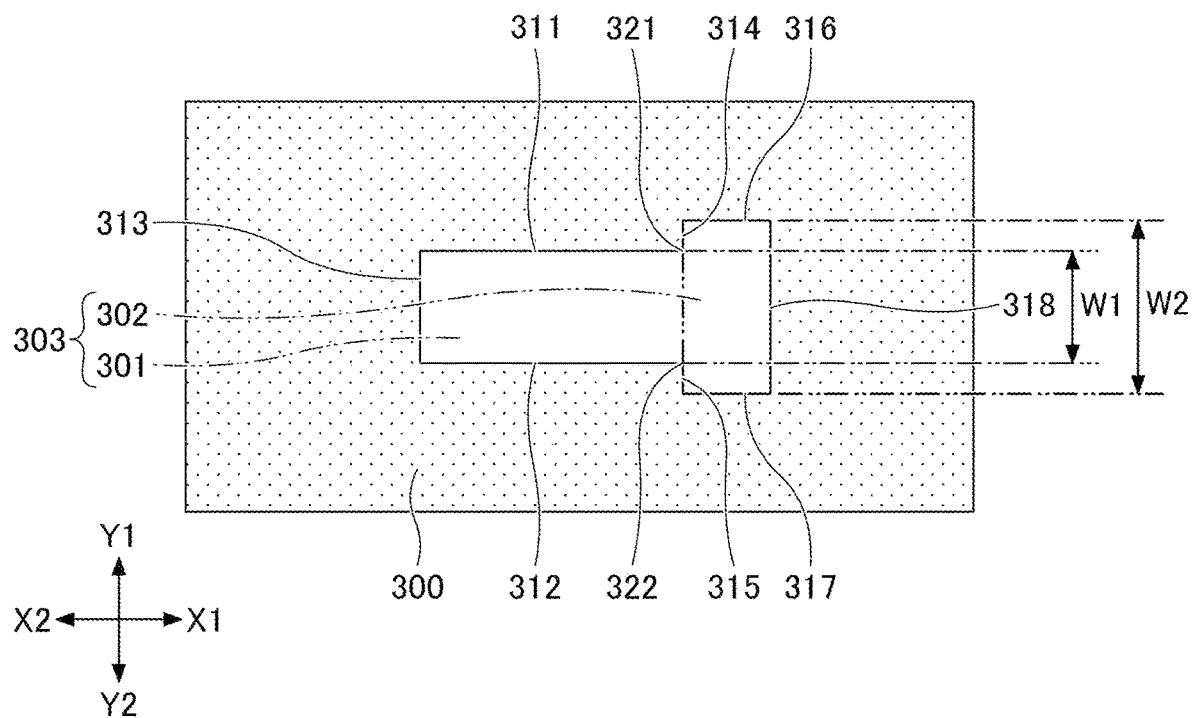

First, a first embodiment is described. The first embodiment relates to a mounting board. FIGS. 1A and 1B are diagrams illustrating a mounting board according to the first embodiment. FIGS. 2A and 2B are enlarged views of part of the mounting board illustrated in FIGS. 1A and 1B. FIGS. 3A and 3B are diagrams separately illustrating an insulating resin layer and an electrode pad, and a solder resist according to the first embodiment. FIG. 1A is a plan view and FIG. 1B is a sectional view taken along the line IB-IB of FIG. 1A. FIG. 2A is a plan view and FIG. 2B is a sectional view taken along the line IIB-IIB of FIG. 2A. FIG. 3A is a plan view illustrating an insulating resin layer and an electrode pad, and FIG. 3B is a plan view illustrating a solder resist.

As illustrated in FIGS. 1A and 1B, a mounting board 1 according to the first embodiment includes an insulating resin layer 100, electrode pads 200 provided on the insulating resin layer 100, and a solder resist 300 (solder resist layer) provided on the insulating resin layer 100 to cover the insulating resin layer 100 and the electrode pads 200. Openings 303 are famed in the solder resist 300, each exposing at least part of the corresponding electrode pad 200. The mounting board 1 includes a total of eight electrode pads 200 in four rows and two columns in a plan view. That is, the electrode pads 200 are arranged in four pairs in the Y1-Y2 direction with two of the electrode pads 200 forming each pair in the X1-X2 direction. For example, the distance between adjacent electrode pads 200 in the X1-X2 direction is 0.5 mm to 1.5 mm, and the distance between adjacent electrode pads 200 in the Y1-Y2 direction is 0.1 mm to 0.2 mm. The insulating resin layer 100 includes a substrate of, for example, epoxy or polyimide (not depicted) and multiple wiring layers (not depicted) provided in the substrate. The electrode pads 200 are connected to one or more of the wiring layers. The solder resist 300 is an example of an insulating protective film.

Here, a description is given, with reference to FIGS. 2A, 2B, 3A and 3B, of the electrode pads 200 on the X1 side ("X1-side electrode pads 200") among the electrode pads 200 arranged in the X1-X2 direction and a configuration of the solder resist 300 around them, taking one of the X1-side electrode pads 200 as an example. FIGS. 2A, 2B, 3A and 3B illustrate the configuration of a region R in FIG. 1A.

The planar shape of the electrode pad 200 is, for example, a rectangle. In a plan view, the electrode pad 200 has a side 211 elongated in the X1-X2 direction and a side 212 elongated in the X1-X2 direction and spaced apart to the Y2 side from the side 211 in the Y1-Y2 direction. The side 211 and the side 212 run parallel to each other. In a plan view, the electrode pad 200 further has a side 213 elongated in the Y1-Y2 direction and a side 214 elongated in the Y1-Y2 direction and spaced apart to the X2 side from the side 213 in the X1-X2 direction. The side 213 and the side 214 run parallel to each other. The side 213 connects an X1 end 221 of the side 211 and an X1 end 222 of the side 212. The side 214 connects an X2 end 223 of the side 211 and an X2 end 224 of the side 212. For example, the side 211 and the side 212 have a length of 0.2 mm to 0.5 mm, and the side 213 and the side 214 have a length of 0.1 mm to 0.3 mm. The side 211 is an example of a first side, the side 212 is an example of a second side, and the side 213 is an example of a seventh side.

The opening 303 has a first opening region 301 and a second opening region 302 that adjoin each other in the X1-X2 direction. At least part of the first opening region 301 lies over the electrode pad 200. The second opening region 302 connects to the first opening region 301 on its X1 side (side 213 side) to expose part of the insulating resin layer 100.

The first opening region 301 is defined by a side 311 and a side 312. The side 311 is positioned on the side 212 side (the Y2 side) of the side 211 of the electrode pad 200. That is, the side 311 is positioned closer to the side 212 than is the side 211 in the Y1-Y2 direction. The side 311 is elongated in the X1-X2 direction. The side 312 is positioned between the side 311 and the side 212 and elongated in the X1-X2 direction. Thus, the side 311 and the side 312 are between the side 211 and the side 212 in the Y1-Y2 direction and run parallel in the X1-X2 direction. The first opening region 301 is further defined by a side 313 that connects the X2 end of the side 311 and the X2 end of the side 312. The side 313 is positioned on the X1 side of the side 214. For example, in a plan view, the distance between the side 311 and the side 211 is 0.03 mm to 0.08 mm, the distance between the side 312 and the side 212 is 0.03 mm to 0.08 mm, and the distance between the side 313 and the side 214 is 0.03 mm to 0.08 mm. The side 311 is an example of a third side, and the side 312 is an example of a fourth side.

The second opening region 302 is defined by a side 314 and a side 315. The side 314 extends to the Y1 side from an X1 end 321 of the side 311. The side 315 extends to the Y2 side from an X1 end 322 of the side 312. That is, the side 314 extends from the end 321 in a direction away from the side 312 in the Y1-Y2 direction, and the side 315 extends from the end 322 in a direction away from the side 311 in the Y1-Y2 direction. Thus, the first opening region 301 adjoins the second opening region 302 at the end 321 and the end 322. The second opening region 302 is further defined by a side 316 and a side 317 that are elongated in the X1-X2 direction and a side 318 that is elongated in the Y1-Y2 direction. The side 316 extends to the X1 side from the Y1 end of the side 314, and the side 317 extends to the X1 side from the Y2 end of the side 315. The side 318 connects the X1 end of the side 316 and the X1 end of the side 317. For example, the side 316 and the side 317 have a length of 0.05 mm to 0.10 mm. The side 314 is an example of a fifth side, and the side 315 is an example of a sixth side.

In the opening 303, a maximum dimension W2 of the second opening region 302 in the Y1-Y2 direction is greater than a distance W1 between the end 321 and the end 322. The maximum dimension W2 is, for example, smaller than or equal to the distance between the side 211 and the side 212. For example, the maximum dimension W2 may be equal to the distance between the side 211 and the side 212. Thus, the opening 303 has a T-letter planar shape.

According to the first embodiment, the end 321 of the side 311 and the end 322 of the side 312 are on the side 213 of the electrode pad 200. That is, the boundary between the first opening region 301 and the second opening region 302 is on the side 213. Furthermore, the side 314 and the side 315 as well are on the side 213. Thus, there is no overlap between the second opening region 302 and the electrode pad 200 in a plan view. The second opening region 302 has the maximum dimension W2 on a straight line L1 connecting the end 221 and the end 222.

The same openings 303 are formed with respect to the remaining three electrode pads 200 placed on the X1 side among the eight electrode pads 200. With respect to the four electrode pads 200 placed on the X2 side among the eight electrode pads 200, the same openings 303 are formed, being reversed in orientation in the X1-X2 direction. That is, for example, with respect to the four electrode pads 200 placed on the X2 side, the second opening region 302 connects to the first opening region 301 on its X2 side. Accordingly, focusing on two openings 303 adjacent in the X1-X2 direction, the second opening region 302 of one opening 303 is positioned on the side away from the other opening 303.

According to the first embodiment, as described in detail below, it is possible to improve the reliability of the connection between the electrode pads 200 and the electrodes of an electronic component mounted on the mounting board 1.

Second Embodiment

Figure 4A:
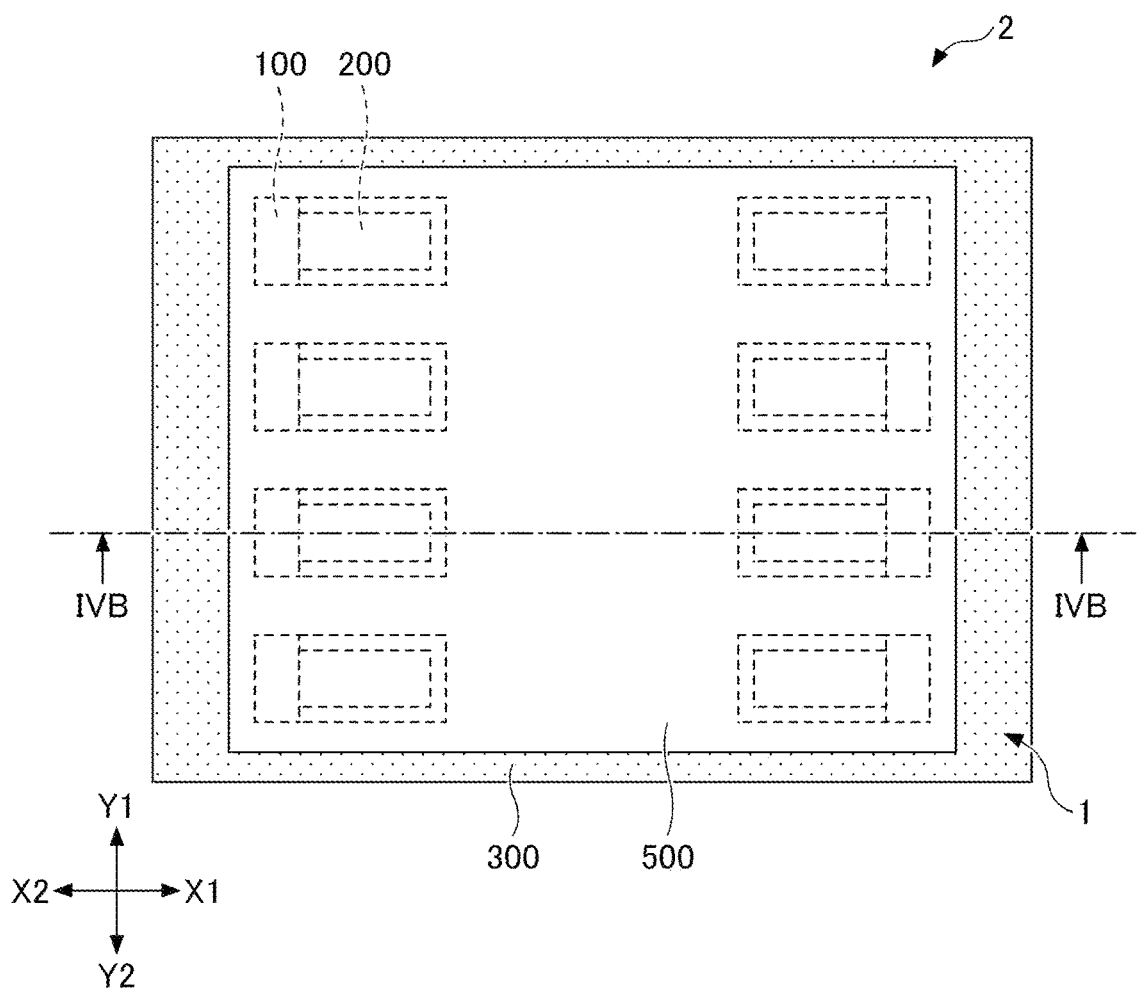
FIGS. 4A and 4B are diagrams illustrating a semiconductor device according to a second embodiment.
Figure 4B:
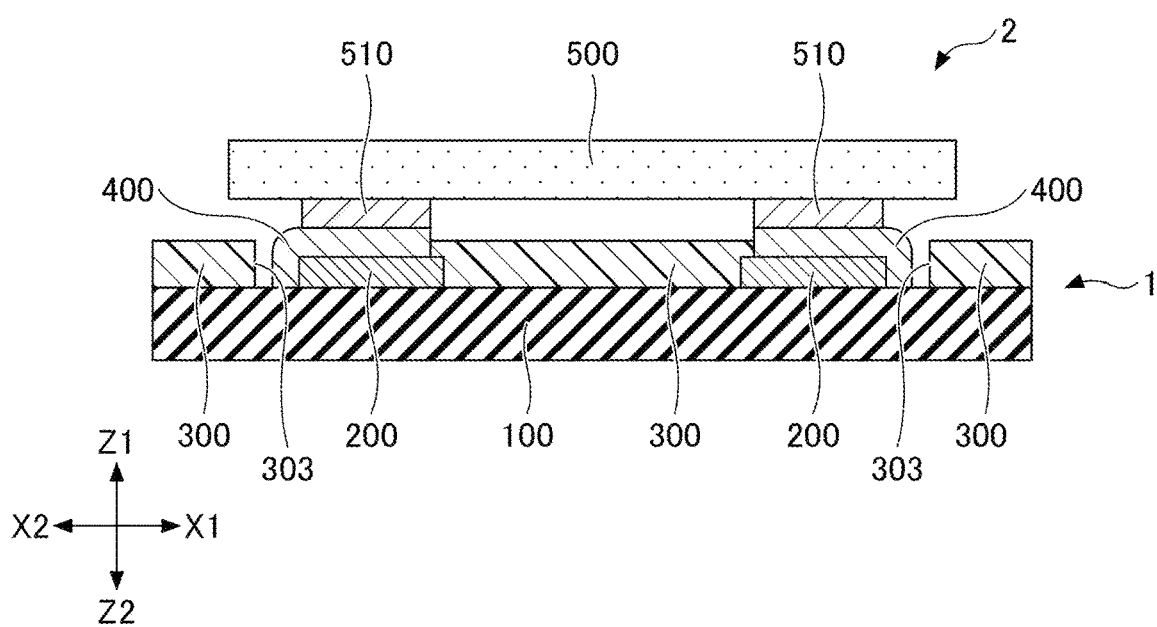

Next, a second embodiment is described. The second embodiment relates to a semiconductor device including the mounting board 1 according to the first embodiment. FIGS. 4A and 4B are diagrams illustrating a semiconductor device according to the second embodiment. FIG. 4A is a plan view and FIG. 4B is a sectional view taken along the line IVB-IVB of FIG. 4A.

As illustrated in FIGS. 4A and 4B, a semiconductor device 2 according to the second embodiment includes the mounting board 1 according to the first embodiment and an electronic component 500 mounted on the mounting board 1. The electronic component 500 includes a total of eight electrodes 510 in four rows and two columns in a plan view.

That is, the electrodes 510 are arranged in four pairs in the Y1-Y2 direction with two of the electrodes 510 forming each pair in the X1-X2 direction. The electrodes 510 face the electrode pads 200 in the Z1-Z2 direction. The electrodes 510 and the electrode pads 200 are connected by solder 400. The solder 400 is an example of an electrically conductive bonding material that connects the electrodes 510 and the electrode pads 200, and is, for example, lead-free Sn—Sb solder.

Figure 5A:
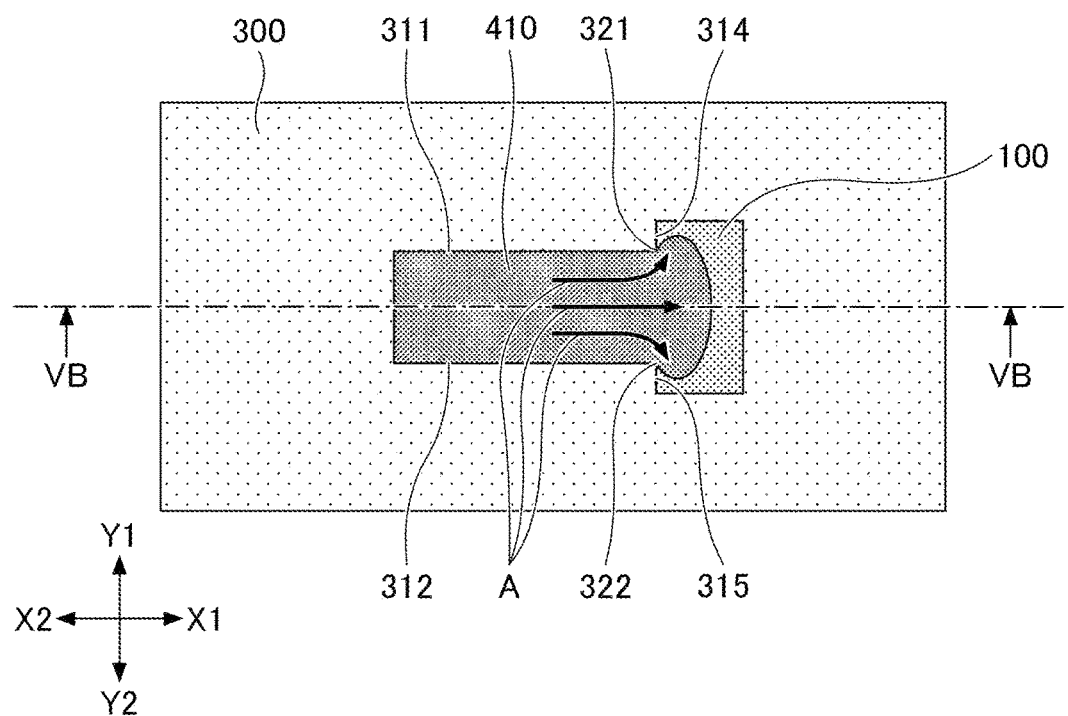
FIGS. 5A and 5B are diagrams illustrating the behavior of solder paste according to a method of manufacturing a semiconductor device according to the second embodiment.
Figure 5B:
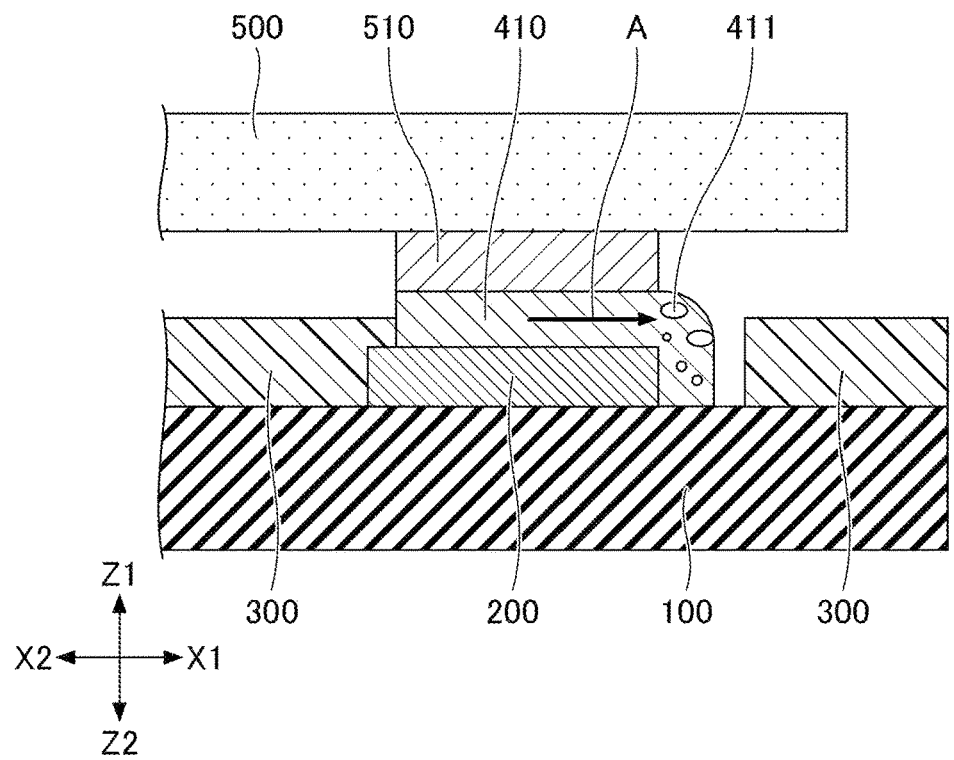

Here, a method of manufacturing the semiconductor device 2 according to the second embodiment is described. FIGS. 5A and 5B are diagrams illustrating the behavior of solder paste according to a method of manufacturing the semiconductor device 2 according to the second embodiment. FIGS. 5A and 5B illustrate a region corresponding to FIGS. 2A and 2B. FIG. 5A is a plan view and FIG. 5B is a sectional view taken along the line VB-VB of FIG. 5A. The electronic component 500 (including the electrodes 510) is omitted in FIG. 5A.

In general, when an electronic component is mounted, solder paste is applied on electrode pads, the electrodes of the electronic component are placed on the solder paste, and a reflow process is performed. Voids are created in the solder paste during the reflow process. For example, voids are created from spaces existing in the solder paste or are created by the vaporization of flux contained in the solder paste. Voids remaining between the electrode pads and the electrodes of the electronic component after the reflow process cause one or more problems such as an increase in electrical resistance and a decrease in mechanical strength, thus making the reliability of connection insufficient. Furthermore, the solder paste containing voids may spread over a solder resist. In this case, solder spreading ahead of a void may be severed at the void during cooling and may remain on the solder resist. The solder remaining on the solder resist may cause a short circuit.

In manufacturing the semiconductor device 2 including the mounting board 1 according to the first embodiment, solder paste 410 is applied on the electrode pads 200 by screen printing or the like, the electrodes 510 of the electronic component 500 are placed on the solder paste 410, and a reflow process is performed. The solder paste 410 is solidified by cooling after the reflow process, so that the solder 400 connecting the electrodes 510 and the electrode pads 200 is obtained. During the reflow process, voids 411 may be created in the solder paste 410.

According to the mounting board 1, the side 314 of the second opening region 302 extends from the end 321 of the side 311 of the first opening region 301 in a direction away from the side 312 in the Y1-Y2 direction, and the side 315 of the second opening region 302 extends from the end 322 of the side 312 of the first opening region 301 in a direction away from the side 311 in the Y1-Y2 direction. Therefore, as indicated by the arrows A in FIGS. 5A and 5B, part of the solder paste 410 easily flows from over the electrode pad 200 to the second opening region 302 during the reflow process. That is, the solder paste 410 is less likely to receive resistance from a wall surface of the second opening region 302 and easily flows into the second opening region 302. At this point, the voids 411 in the solder paste 410 are more likely to move to the second opening region 302 than to remain between the electrode pad 200 and the electrode 510. Accordingly, it is possible to improve connection reliability by reducing the voids 411 remaining between the electrode pad 200 and the electrode 510 after the reflow process.

Furthermore, the second opening region 302 can store the solder paste 410 that has flown out from between the electrode pad 200 and the electrode 510. Therefore, the solder paste 410 can be less likely to spread over the solder resist 300. Moreover, the solder paste 410 moves toward the second opening region 302 from the first opening region 301. Therefore, even if solder solidified after cooling remains on the solder resist 300, the position of the remaining solder is closer to an edge of the electronic component 500 than are the electrode pad 200 and the electrode 510 in a plan view. For example, focusing on the four pairs of the electrode pads 200 and the electrodes 510 positioned on the X1 side, solder remains at positions further to the X1 side than these electrode pads 200 and electrodes 510. Furthermore, focusing on the four pairs of the electrode pads 200 and the electrodes 510 positioned on the X2 side, solder remains at positions further to the X2 side than these electrode pads 200 and electrodes 510. Solder remaining at such positions is not surrounded by the electrode pads 200 and the electrodes 510 and is therefore easily removable from between the mounting board 1 and the electronic component 500 by, for example, ultrasonic cleaning. Thus, by using the mounting board 1 according to the first embodiment, it is possible to control the remaining of solder on the solder resist 300, and even if solder remains, it is possible to cause the solder to remain at a position where the solder is easily removable.

The Y1 edge (the side 316) of the second opening region 302 is preferably on a line extending from the side 211 in a plan view. This is because if the side 316 is on the opposite side of the line extending from the side 211 from the side 311, namely, on the Y1 side of the line extending from the side 211, in the Y1-Y2 direction, there may a short circuit between the second opening region 302 of the opening 303 and the second opening region 302 of the adjacent opening 303 provided on the Y1 side of the opening 303. For the same reason, the Y2 side 317 of the second opening region 302 is preferably on a line extending from the side 212 in a plan view.

In a plan view, the Y1 side 316 of the second opening region 302 may also be on the side 311 side (Y2 side) of the line extending from the side 211 in the Y1-Y2 direction, and the Y2 side 317 of the second opening region 302 may also be on the side 312 side (Y1 side) of the line extending from the side 212 in the Y1-Y2 direction.

VARIATIONS

Figure 6A:
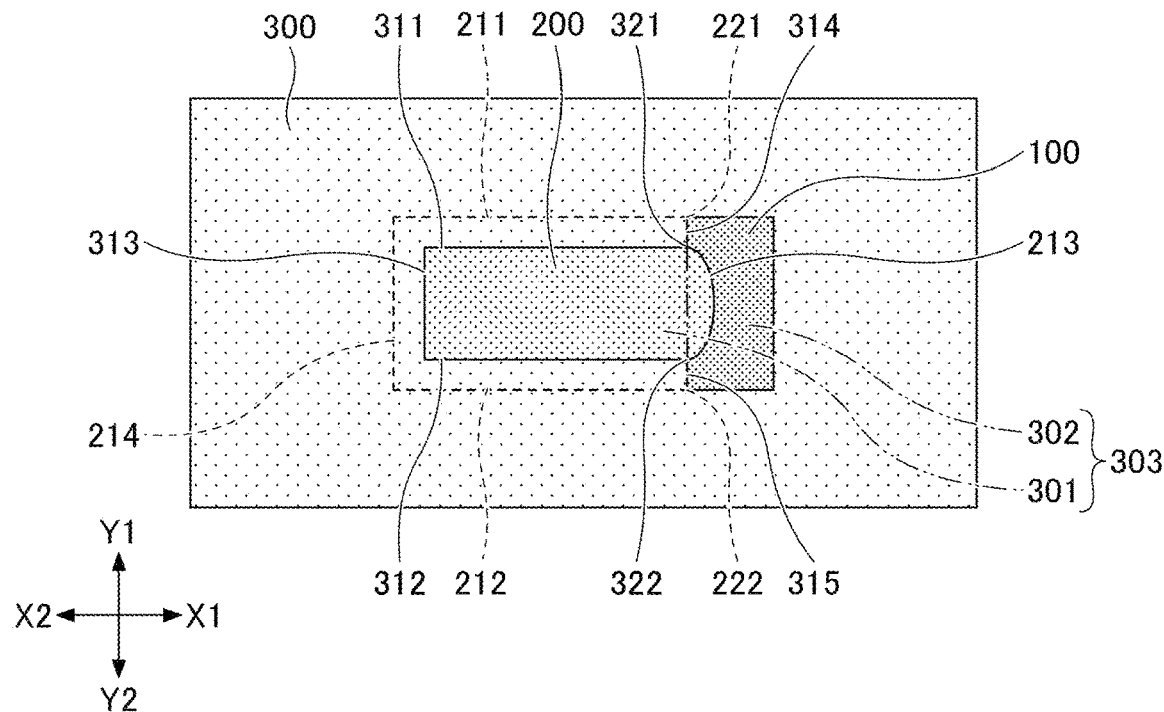
FIGS. 6A and 6B are plan views illustrating a first variation and a second variation, respectively.
Figure 6B:
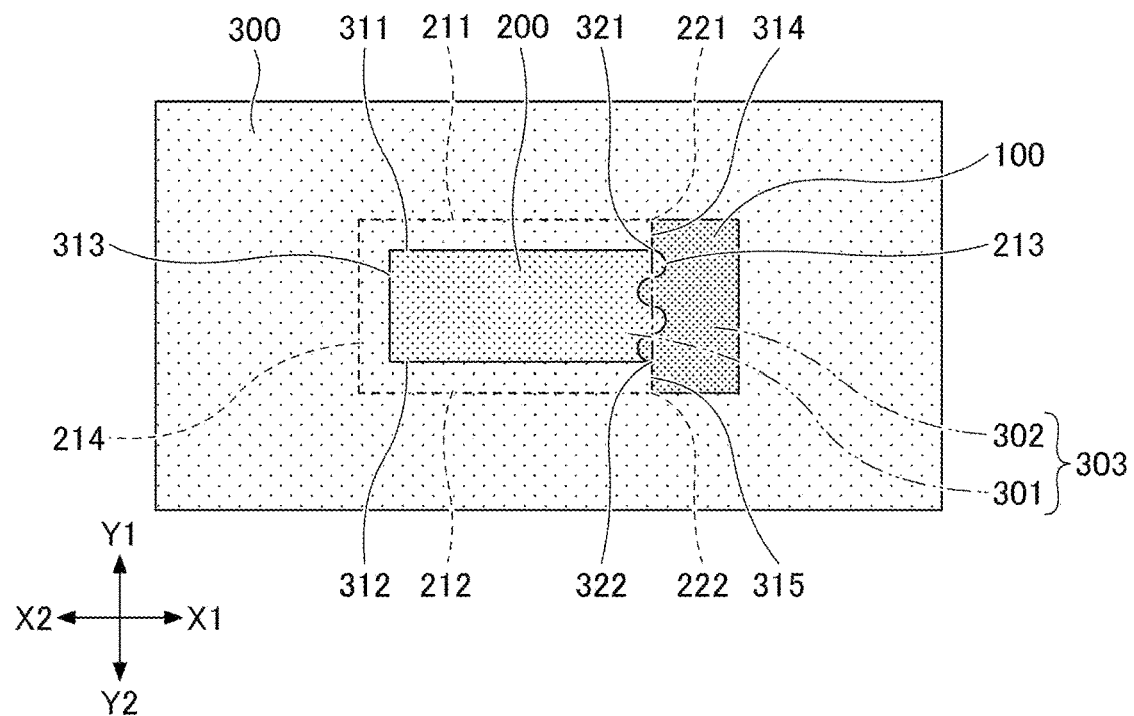

Next, variations are described. The planar shape of the electrode pad 200 may be, but is not limited to, a rectangle. FIGS. 6A and 6B are plan views illustrating a first variation and a second variation, respectively.

As illustrated in FIG. 6A, the side 213 of the electrode pad 200 may include a circular arc portion that bulges to the X1 side. This accelerates the flow of the solder paste 410 to the second opening region 302 to make it easy to remove the voids 411 from between the electrode pad 200 and the electrode 510.

As illustrated in FIG. 6B, the side 213 of the electrode pad 200 may include a waveform portion including multiple local maxima (crests) and local minima (troughs). This causes collisions between portions of the solder paste 410 near the side 213 to facilitate removal of the voids 411 from within the solder paste 410.

The end 321 of the side 311 and the end 322 of the side 312 of the first opening region 301 does not have to be on a line segment connecting the end 221 of the side 211 and the end 222 of the side 212 of the electrode pad 200. FIGS.

7A and 7B are plan views illustrating a third variation and a fourth variation, respectively.

Figure 7A:
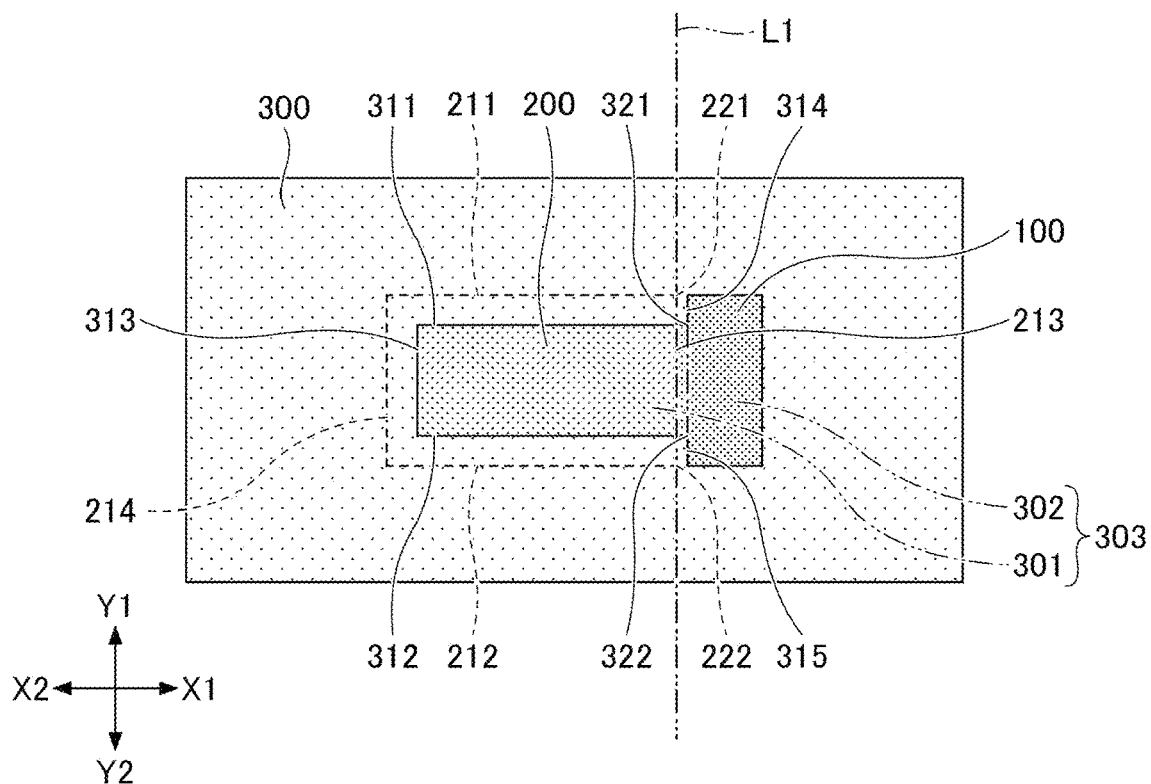
FIGS. 7A and 7B are plan views illustrating a third variation and a fourth variation, respectively.
Figure 7B:
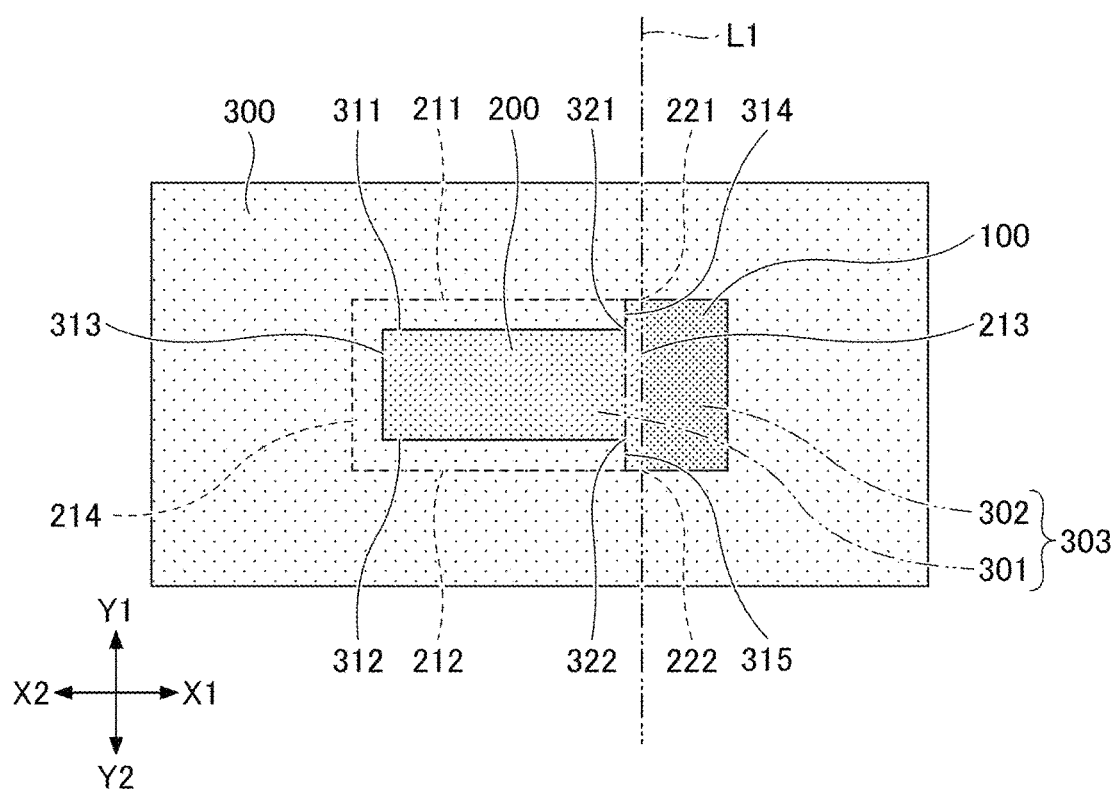

As illustrated in FIG. 7A, the end 321 and the end 322 may be on the X1 side of the straight line L1 connecting the end 221 and the end 222. Conversely, as illustrated in FIG. 7B, the end 321 and the end 322 may be on the X2 side of the straight line L1 connecting the end 221 and the end 222.

Figure 8:
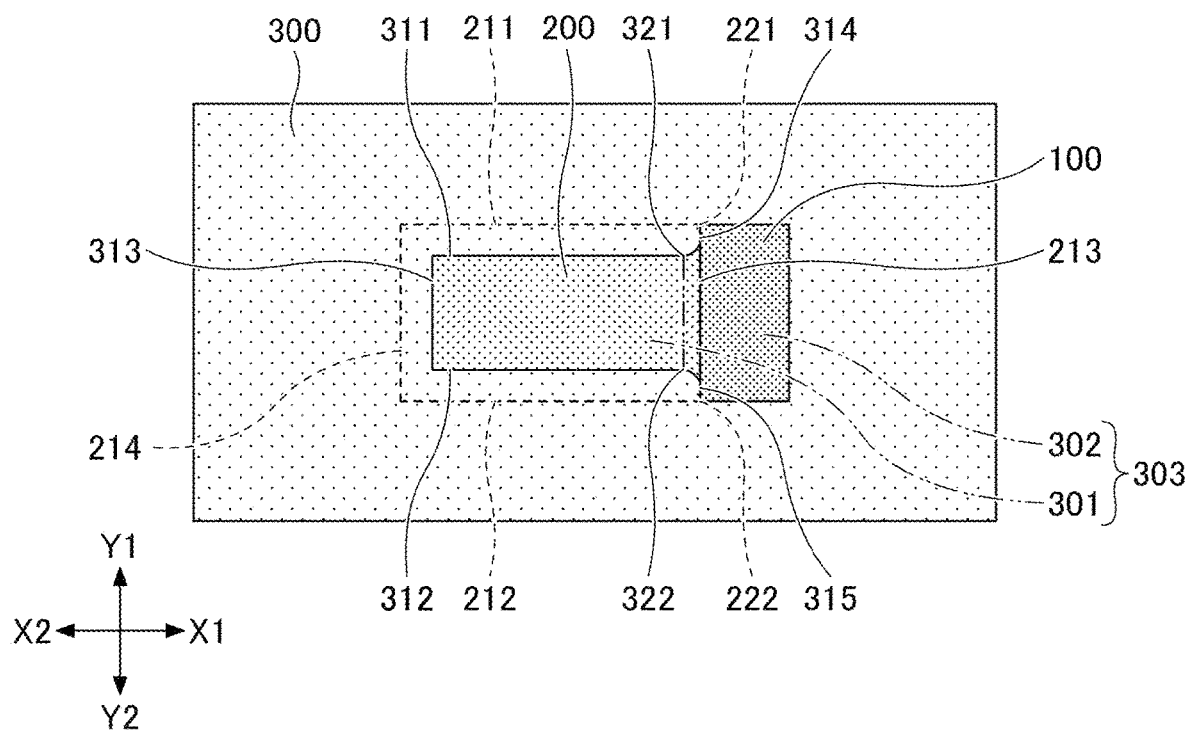
FIG. 8 is a plan view illustrating a fifth variation.

Each side does not have to be a line segment. FIG. 8 is a plan view illustrating a fifth variation.

As illustrated in FIG. 8, the side 314 may include a tapered portion that curves from the end 321 in a flaring manner, and the side 315 may include a tapered portion that curves from the end 322 in a flaring manner.

Figure 9:
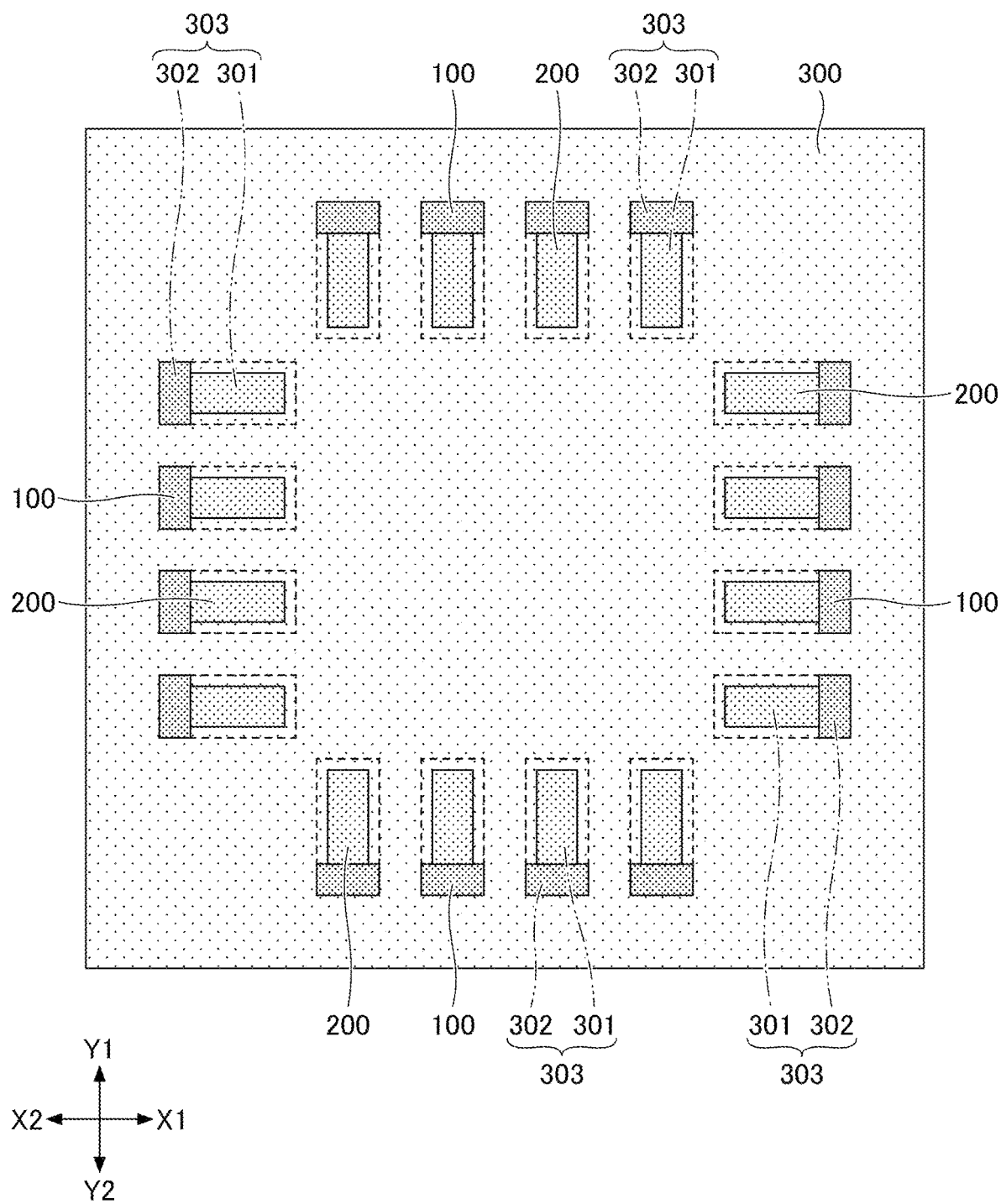
FIG. 9 is a plan view illustrating a sixth variation.

The number of electrode pads and the arrangement of electrode pads are not limited in particular. FIG. 9 is a plan view illustrating a sixth variation.

As illustrated in FIG. 9, a total of sixteen electrode pads 200 may be provided on the insulating resin layer 100, and a total of sixteen openings 303 may correspondingly be formed in the solder resist 300. For example, the sixteen electrode pads 200 may be arranged four along each of the four sides of the insulating resin layer 100 having a rectangular planar shape. In this case, in each opening 303, the second opening region 302 is preferably provided on the side more distant from the center of the insulating resin layer 100 than is the first opening region 301. This is because even if solder remains on the solder resist 300, the solder is easily removable by ultrasonic cleaning or the like as described above.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

What is claimed is:
1. A mounting board comprising:
an insulating resin layer;
an electrode pad on the insulating resin layer; and
an insulating protective film covering the electrode pad and the insulating resin layer,
wherein, in a plan view,
the electrode pad includes a first side and a second side that are elongated in a first direction and are positioned parallel in a second direction perpendicular to the first direction,
the insulating protective film includes an opening including a first opening region and a second opening region that adjoin each other in the first direction, the first opening region lying over the electrode pad to expose a part of the electrode pad, the second opening region exposing a part of the insulating resin layer,
the first opening region is defined by a third side and a fourth side that are between the first side and the second side in the second direction, are elongated in the first direction, and are positioned parallel in the second direction, and
a maximum dimension of the second opening region in the second direction is greater than a distance between an end of the third side and an end of the fourth side at which the first opening region adjoins the second opening region.

2. The mounting board as claimed in claim 1, wherein the second opening region is further defined by
a fifth side extending from the end of the third side in a direction away from the fourth side along the second direction; and
a sixth side extending from the end of the fourth side in a direction away from the third side along the second direction.

3. The mounting board as claimed in claim 1, wherein
the electrode pad further includes a seventh side connecting an end of the first side and an end of the second side to face toward the second opening region, and
the second opening region has the maximum dimension on a straight line connecting the end of the first side and the end of the second side.

4. The mounting board as claimed in claim 1, wherein, in the plan view,
a first edge of the second opening region in the second direction is on a line extending from the first side, and
a second edge of the second opening region in the second direction is on a line extending from the second side.

5. The mounting board as claimed in claim 1, wherein
the electrode pad further includes a seventh side connecting an end of the first side and an end of the second side to face toward the second opening region, and
the seventh side includes a curve.

6. The mounting board as claimed in claim 1, further comprising:
an additional electrode pad adjacent to the electrode pad in the first direction on the insulating resin layer, the additional electrode pad having a same configuration as the electrode pad,
wherein the insulating protective film further includes an additional opening at a position corresponding to the additional electrode pad, the additional opening having a same configuration as the opening, and
the second opening region of each of the opening and the additional opening is positioned on a side away from the other of the opening and the additional opening.

7. The mounting board as claimed in claim 1, wherein there is no overlap between the second opening region and the electrode pad in the plan view.

8. The mounting board as claimed in claim 1, wherein the insulating protective film is a solder resist layer.

9. A semiconductor device comprising:
the mounting board as set forth in claim 1; and
an electronic component including an electrode connected to the electrode pad of the mounting board by an electrically conductive bonding material.

10. The semiconductor device as claimed in claim 9, wherein the electrically conductive bonding material is solder.

* * * * *